(12) United States Patent
Hayashi

(10) Patent No.: US 8,013,534 B2
(45) Date of Patent: Sep. 6, 2011

(54) ELECTRO-OPTIC DEVICE AND ELECTRONIC APPARATUS

(75) Inventor: Takaaki Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 965 days.

(21) Appl. No.: 11/939,717

(22) Filed: Nov. 14, 2007

(65) Prior Publication Data

US 2008/0122389 A1 May 29, 2008

(30) Foreign Application Priority Data

Nov. 28, 2006 (JP) .................................. 2006-319739

(51) Int. Cl.
G09G 3/10 (2006.01)
(52) U.S. Cl. ..................... 315/169.3; 315/294; 315/313; 345/80; 345/206; 345/690
(58) Field of Classification Search .................. 315/160, 315/161, 169.3, 169.4, 291, 294, 307, 312, 315/313, 324; 345/77, 80, 204, 206, 690
See application file for complete search history.

(56) References Cited

U.S. PATENT DOCUMENTS

| | | | |
|---|---|---|---|
| 5,150,016 A * | 9/1992 | Sawase et al. ................. | 315/294 |
| 6,081,305 A | 6/2000 | Sato et al. | |
| 6,525,718 B1 * | 2/2003 | Murakami et al. ............ | 345/206 |
| 6,590,629 B1 | 7/2003 | Hirobe et al. | |
| 7,023,415 B2 | 4/2006 | Fujita et al. | |
| 7,256,802 B2 * | 8/2007 | Park et al. ........................ | 345/87 |
| 7,719,526 B2 * | 5/2010 | Kimura et al. ................. | 345/204 |
| 2002/0033790 A1 | 3/2002 | Sato et al. | |
| 2005/0200301 A1 * | 9/2005 | Yamazaki et al. .......... | 315/169.3 |
| 2005/0237002 A1 * | 10/2005 | Nakamura .................. | 315/169.3 |
| 2006/0022969 A1 * | 2/2006 | Lee et al. ....................... | 345/211 |

FOREIGN PATENT DOCUMENTS

| | | |
|---|---|---|
| JP | A-9-26583 | 1/1997 |
| JP | A-2000-227783 | 8/2000 |
| JP | A-2003-308049 | 10/2003 |
| JP | A-2006-154835 | 6/2006 |

* cited by examiner

*Primary Examiner* — Douglas W Owens
*Assistant Examiner* — Tung X Le
(74) *Attorney, Agent, or Firm* — Oliff & Berridge, PLC

(57) ABSTRACT

An electro-optic device includes a substrate on which a plurality of electro-optic elements are configured, a plurality of IC chips that drive the electro-optic elements, and a plurality of wiring patterns. Each of the IC chips includes a first power terminal and a second power terminal connected to each other in the IC chip, a third power terminal sandwiching the first power terminal with the second power terminal and placed on a first side opposite to the second power terminal, and a fourth power terminal sandwiching the second power terminal with the first power terminal and placed on a second side opposite to the first power terminal. The wiring patterns include a first power trunk line connecting the second power terminal in a first IC chip among from the IC chips and the first power terminal in a second IC chip placed on the second side of the first IC chip, a second power trunk line connecting the fourth power terminal in the first IC chip and the third power terminal in the second IC chip, a first electric supply line that supplies a first potential for driving the electro-optic elements from a power supply circuit to the first power terminal in the first IC chip, and a second electric supply line that supplies a second potential for driving the electro-optic elements from the power supply circuit to the third power terminal in the first IC chip.

7 Claims, 9 Drawing Sheets

ELECTRO-OPTIC DEVICE AND ELECTRONIC APPARATUS

BACKGROUND

1. Technical Field

The present invention relates to the technology for mounting a plurality of integrated circuit (IC) chips used to control electro-optic elements.

2. Related Art

Electro-optic devices using a plurality of IC chips in order to drive various electro-optic elements such as organic light-emitting diode elements have been suggested. For example, JP-A-2006-154835 discloses a display device in which a plurality of IC chips are connected to one another in a cascade configuration. In a configuration of the display device disclosed in JP-A-2006-154835, capacitance or resistance associated with a transmission line of a signal (hereinafter, referred to as a "control signal") for controlling each of the IC chips is decreased, for example, compared with a case where the IC chips are connected to a common wiring pattern. Accordingly, distortion of the control signal can be suppressed, so that a high-speed control of each of the IC chips can be realized.

In the configuration of the display device disclosed in JP-A-2006-154835, various types of potentials are supplied through a plurality of electric supply lines configured on the surface of a substrate to each of the IC chips. That is, as shown in FIG. 10, a potential V1 is supplied through a common electric supply line 93 to each of a plurality of IC chips 91, and a potential V2 is supplied through a common electric supply line 94 to each of the IC chips 91. However, in the configuration shown in FIG. 10, a structure (multilayer structure) in which the electric supply lines 93 and 94 intersect one another on the surface of the substrate at portions A shown in FIG. 10 is required. Accordingly, the configuration has disadvantages, for example, in that the manufacture cost of electro-optic devices is increased or in that each of the portions in which the electric supply lines 93 and 94 intersect one another is easily short-circuited.

SUMMARY

An advantage of some aspects of the invention is that the number of intersections of wiring patterns for supplying potentials to each of a plurality of IC chips can be decreased.

According to an aspect of the invention, there is provided an electro-optic device including a substrate on which a plurality of electro-optic elements are configured, a plurality of IC chips that drive the electro-optic elements, and a plurality of wiring patterns. Each of the IC chips includes a first power terminal (for example, a power terminal RAn shown in FIG. 5) and a second power terminal (for example, a power terminal RBn shown in FIG. 5) connected to each other in the IC chip, a third power terminal (for example, a power terminal RA1 shown in FIG. 5) sandwiching the first power terminal with the second power terminal and placed on a first side opposite to the second power terminal (the negative side of the X axis shown in FIG. 5), and a fourth power terminal (for example, a power terminal RB1 shown in FIG. 5) sandwiching the second power terminal with the first power terminal and placed on a second side opposite to the first power terminal (the positive side of the X axis shown in FIG. 5). The wiring patterns include a first power trunk line (for example, a power trunk line 63 shown in FIG. 5) connecting the second power terminal in a first IC chip among from the IC chips and the first power terminal in a second IC chip placed on the second side of the first IC chip, a second power trunk line (for example, a power trunk line 63 shown in FIG. 5) connecting the fourth power terminal in the first IC chip and the third power terminal in the second IC chip, a first electric supply line (for example, an electric supply line 65 shown in FIG. 5) that supplies a first potential for driving the electro-optic elements from a power supply circuit to the first power terminal in the first IC chip, and a second electric supply line (for example, an electric supply line 65 shown in FIG. 5) that supplies a second potential for driving the electro-optic elements from the power supply circuit to the third power terminal in the first IC chip.

With this configuration, while the first and second potentials are supplied from the power supply circuit to the first IC chip, the first and second potentials are indirectly supplied through the first IC chip to the second IC chip. Accordingly, the number of intersections between the power trunk lines and the electric supply lines can be decreased.

It is preferable that in each of the IC chips, the first and second power terminals be symmetrically arranged about a predetermined reference line (for example, a central line of the IC chip), and the third and fourth power terminals be symmetrically arranged about the central line. In the aspect, since the power terminals corresponding to one another are symmetrically arranged about the predetermined reference line, the position or shape of a wiring pattern connected to each of the power terminals can be simplified.

It is preferable that each of the IC chips include a plurality of first signal terminals (for example, signal terminals QA1 to QAm shown in FIG. 5) arranged on the first side of the third power terminal and a plurality of second signal terminals (for example, signal terminals QB1 to QBm shown in FIG. 5) arranged on the second side of the fourth power terminal and connected to the corresponding plurality of first signal terminals in the IC chip, and drive the electro-optic elements on the basis of a control signal supplied to a corresponding one of the first signal terminals. It is preferable that the wiring patterns include a plurality of signal trunk lines (for example, signal trunk lines 61 shown in FIG. 5) connecting each of the second signal terminals in the first IC chip and a corresponding one of the first signal terminals in the second IC chip. In the aspect, since the first signal terminals and the second signal terminals are arranged on the both sides of the power terminals, the number of intersections between the power trunk lines or the electric supply lines and the signal trunk lines can be decreased.

It is further preferable that in each of IC chips, each of the first signal terminals and a corresponding one of the second signal terminals connected to the first signal terminal be symmetrically arranged about the central line of the IC chip. In the aspect, since the signal terminals corresponding to one another are symmetrically arranged about the central line of the IC chip, the position or shape of a wiring pattern connected to each of the signal terminals can be simplified.

It is preferable that each of the IC chips include a switching unit (for example, a switching circuit 27 shown in FIG. 7) configured to switch between a first state in which the control signal supplied to the first signal terminal is output to the second signal terminal in the IC chip and a second state in which the control signal supplied to the second signal terminal is output to the first signal terminal in the IC chip. In the aspect, since the direction of control signal transmission can be switched by the switching unit, integrated circuits can have a common configuration irrespective of the direction of control signal transmission. It is further preferable that each of the IC chips include a control terminal placed between the first power terminal and the second power terminal, and the switching unit be configured to switch between the first state and the second state on the basis of a signal supplied to the control terminal.

The electro-optic device according to the above-described aspect, of the invention is used in various types of electronic apparatuses. A typical example of an electric apparatus according to another aspect of the invention is an image forming apparatus using an electrophotographic method in which an electro-optic device according to the aspect of the invention is used to expose an image carrier such as a photosensitive drum. The image forming apparatus includes an image carrier on which a latent image is formed by the exposure, an electro-optic device according to the aspect of the invention for exposing the image carrier, and a developing device for depositing developer (for example, toner) on the basis of the latent image on the image carrier to form a visualized image. The applications of the electro-optic device according to the aspect of the invention are not limited to the exposure of the image carrier. For example, in an image reading apparatus such as a scanner, the electro-optic device according to the aspect of the invention can be used to illuminate an original document. The image reading apparatus includes the electro-optic device according to the aspect of the invention and a light-receiving device (for example, a light-receiving element such as a charge coupled device, (CCD)) for converting light that is emitted from the electro-optic device and reflected from an object to be read (original document) to an electric signal. Additionally, the electro-optic device in which the electro-optic elements are arranged in a matrix may be used as a display device in various types of electronic apparatuses such as personal computers or cellular telephones.

BRIEF DESCRIPTION OF THE DRAWINGS

The invention will he described with reference to the accompanying drawings, wherein like numbers reference like elements.

DESCRIPTION OF EXEMPLARY EMBODIMENTS

First Embodiment

Figure 1:
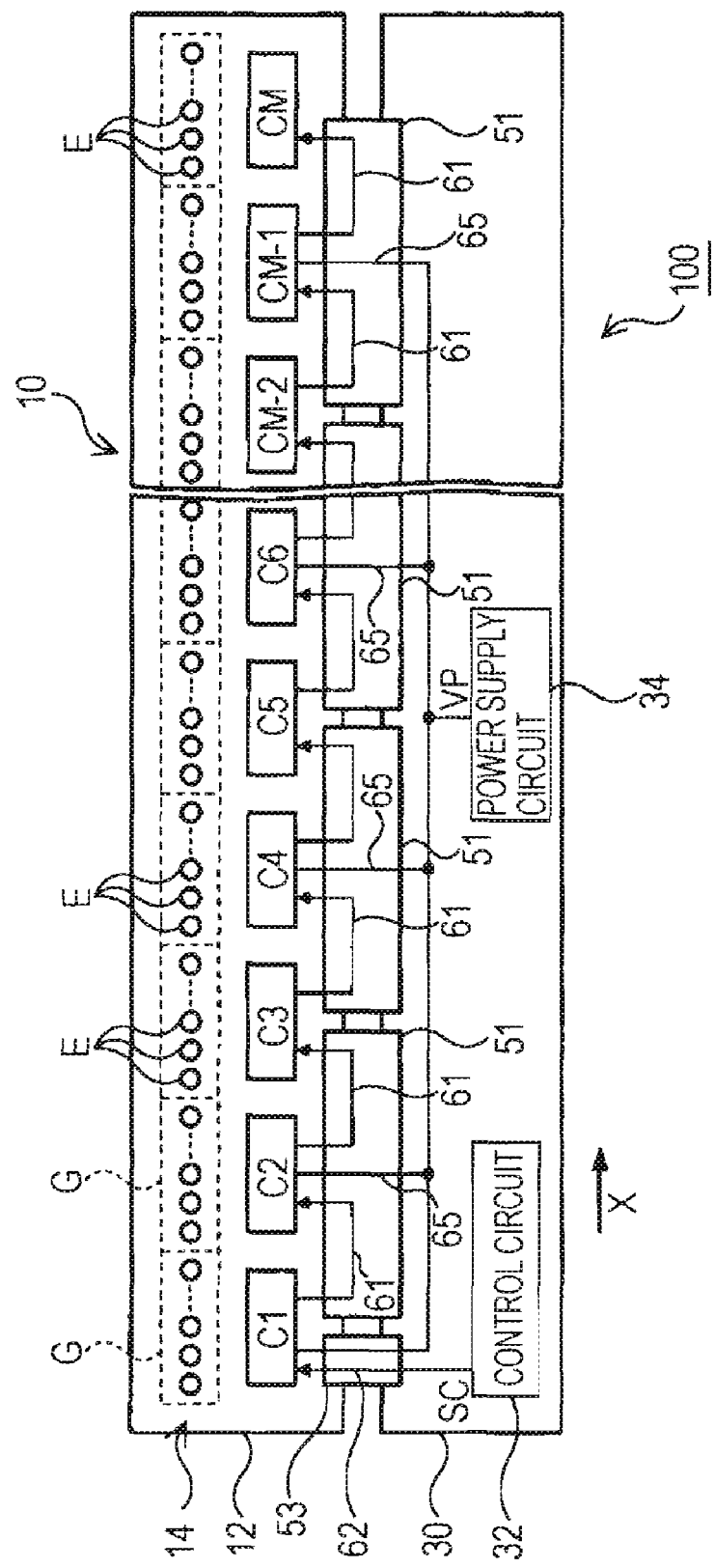
FIG. 1 is a plan view showing a configuration of an electro-optic device according to a first embodiment.

FIG. 1 is a plan view showing a schematic configuration of an electro-optic device according to a first embodiment of the invention. An electro-optic device 100 is employed as a line head for exposing a photosensitive drum in an image forming apparatus using an electrophotographic method. As shown in FIG. 1, the electro-optic device 100 includes an exposure unit 10 for emitting light on the basis of a desired image onto a photosensitive drum, a printed circuit substrate 30 on which a control circuit 32 and a power supply circuit 34 are mounted, and a plurality of flexible printed circuit substrates 51 electrically connecting the exposure unit 10 and the printed circuit substrate 30.

The exposure unit 10 has a configuration in which a light-emitting portion 14 is configured on the surface of a substrate 12 with a rectangle shape, and the substrate 12 is fixed such that the longitudinal side of the substrate 12 lies in the X direction (main scanning direction). The light-emitting portion 14 includes a plurality of electro-optic elements E that are configured on the surface of the substrate 12 and arranged in the X direction. The electro-optic elements E according to the first embodiment are organic light-emitting diodes each of which has an anode and a cathode facing each other and a light-emitting layer including an organic electroluminescence (EL) material therebetween. A configuration in which the plurality of the electro-optic elements E are arranged in a plurality of rows (for example, two staggered rows) along the X axis can be employed.

The electro-optic elements E are divided into M groups G in units of N elements (each of N and M is a positive integer). The exposure unit 10 includes M IC chips C (C1 to CM) each of which corresponds to a different one of the groups G, The M IC chips C are mounted on the surface of the substrate 12 using chip on glass (COG) technology and arranged in the X direction in a space between the light-emitting portion 14 and the printed circuit substrate 30, The IC chips C has a common configuration. In the descriptions below, a certain one of the M IC chips C may also be referred to specifically as the "IC chip Ck" (k is an integer satisfying $1 \leq k \leq M$).

Figure 2:
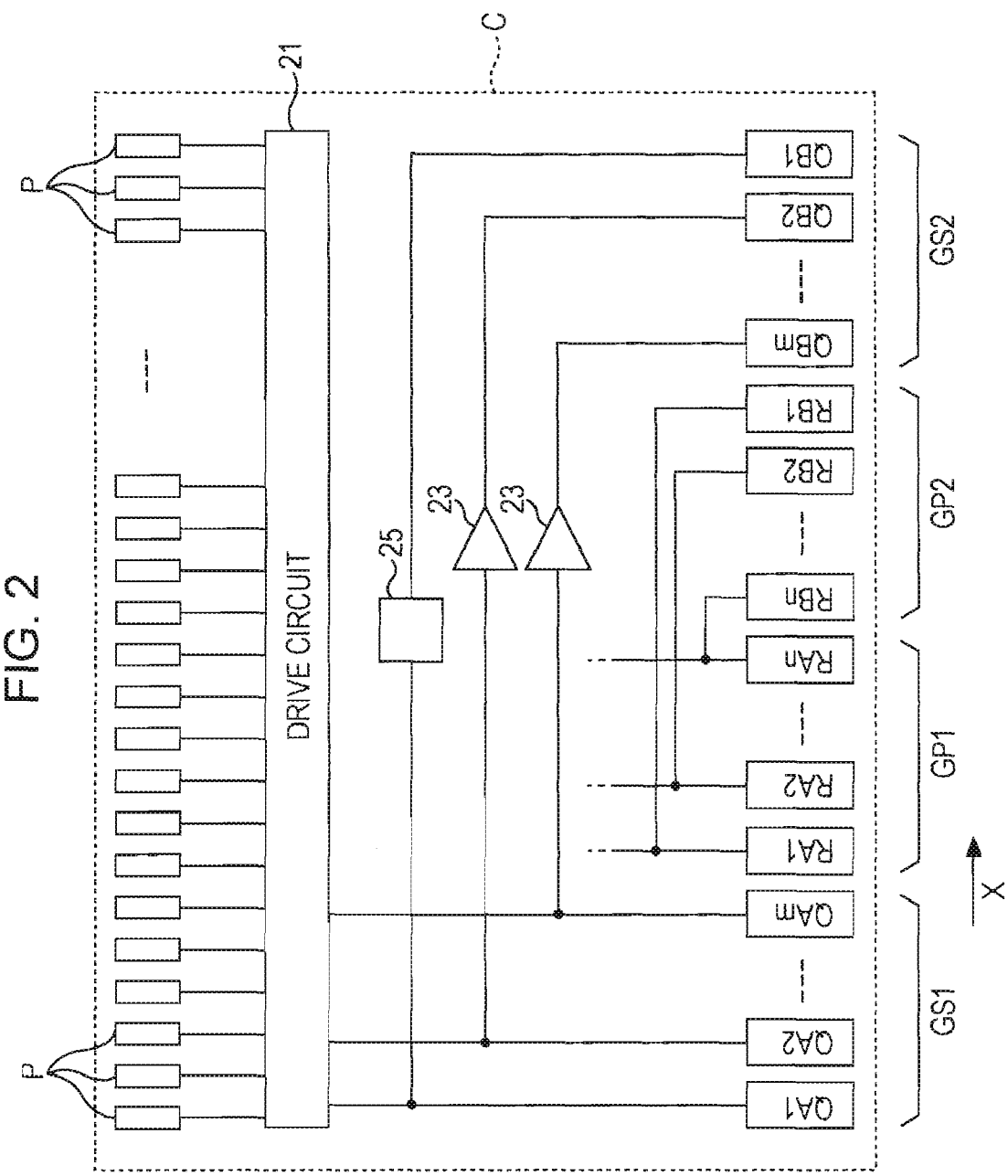
FIG. 2 is a block diagram showing an electrical configuration of an IC chip.
Figure 3:
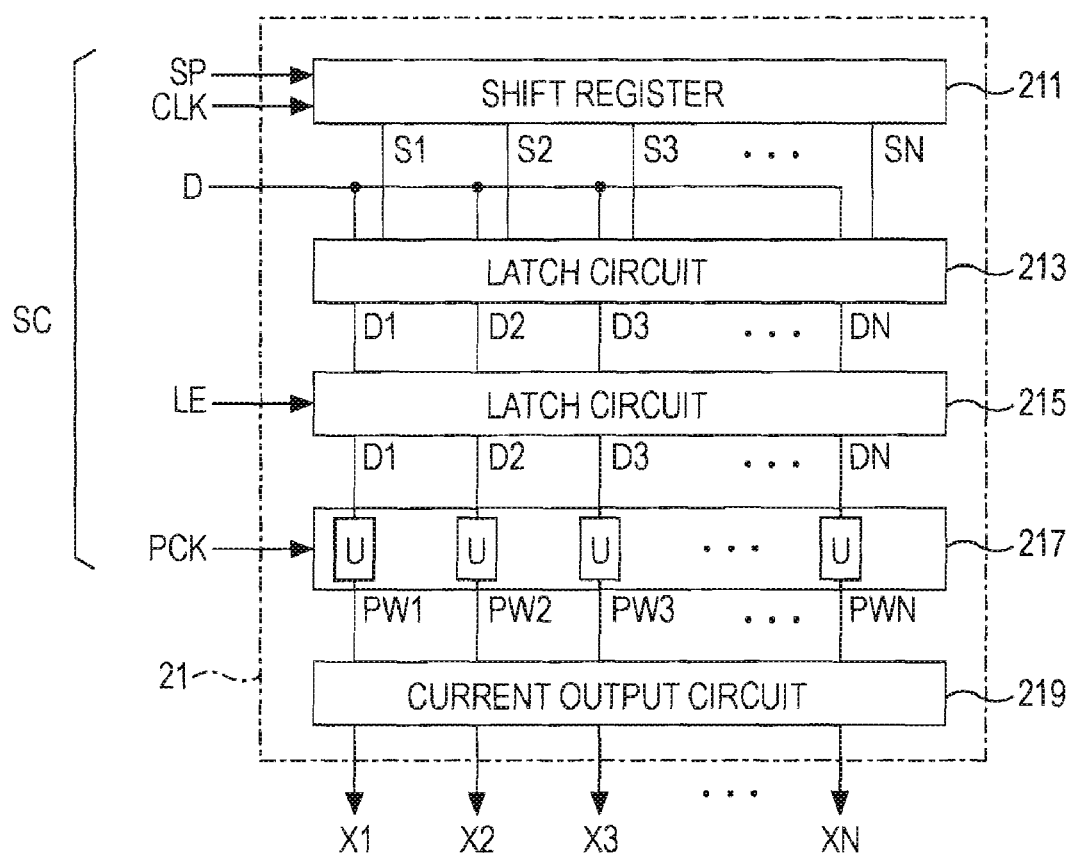
FIG. 3 is a block diagram showing a configuration of a drive circuit.

FIG. 2 is a block diagram showing an electrical configuration of each of the IC chips C, As shown in FIG. 2, the IC chip C has a drive circuit 21 for driving the electro-optic elements E. FIG. 3 is a block diagram showing a concrete configuration of the drive circuit 21. As shown in FIG. 3, the drive circuit 21 of the IC chip Ck generates and outputs driving signals X1 to XN on the basis of gradation data D to control gradations (amounts of light emitted) of the N electro-optic elements E belonging to the k-th group G. The gradation data D defines gradations of the electro-optic elements E.

A shift register 211, a latch circuit 213, and a latch circuit 215 shown in FIG. 3 expand the gradation data D serially supplied to the drive circuit 21 into N signals corresponding to the total number of electro-optic elements E in one of the groups G. The shift register 211 sequentially shifts a starting pulse SP at a timing in synchronization with a clock signal CLK to output sampling signals S1 to SN. Accordingly, the levels of the sampling signals S1 to SN sequentially reach an active level at periods of the clock signal CLK.

Pieces of the gradation data D is serially supplied to the latch circuit 213. The latch circuit 213 samples the pieces of the gradation data D (hereinafter, may also be referred to specifically as the "gradation data Dh") when the level of the sampling signal Sh (h is an integer satisfying $1 \leq k \leq N$) reaches the active level. In a horizontal scanning period, immediately after the latch circuit 213 in each of the M drive circuits 21 has acquired M pieces of the gradation data D1 to DN, the N pieces of the gradation data D1 to DN are simultaneously output from the latch circuit 215 at a timing corresponding to the rising edge of a light-emitting-enable signal LE at the beginning of the horizontal scanning period.

A pulse drive circuit 217 configured as a subsequent stage of the latch circuit 215 includes N unit circuits U. A pulse-control clock PCK is supplied to each of the unit circuits U. The h-th unit circuit U outputs a signal PWh having a pulse width on the basis of the gradation data Dh supplied from the latch circuit 215. A current output circuit 219 generates the driving signals X1 to XN. The driving signal Xh supplied to the h-th electro-optic element E in one of the groups G is a current signal used as a driving current (current allowing light emission of the electro-optic element E) for a period corresponding to the pulse width of the signal PWh in each horizontal scanning period.

A control circuit 32 shown in FIG. 1 generates and outputs various types of control signals SC (the gradation data D, the starting pulse SP, the clock signal CLK, the light-emitting-enable signal LE, and the pulse-control clock PCK) as described above to control the drive circuit 21 of each of the IC chips C. In addition, the power supply circuit 34 shown in FIG. 1 generates and outputs a plurality of potentials (hereinafter, referred to as "power supply potentials VP") that are necessary for functions of each of the drive circuits 21 or each of the electro-optic elements E. The power supply potentials VP generated in the power supply circuit 34 according to the first embodiment include a potential used as a power supply for each portion in the drive circuit 21, a potential corresponding to a high or low level for logic circuits in the drive circuit 21, a potential used as a power supply for a driving current supplied to the electro-optic elements E, and a ground voltage used as a reference voltage in the drive circuit 21.

Figure 4:
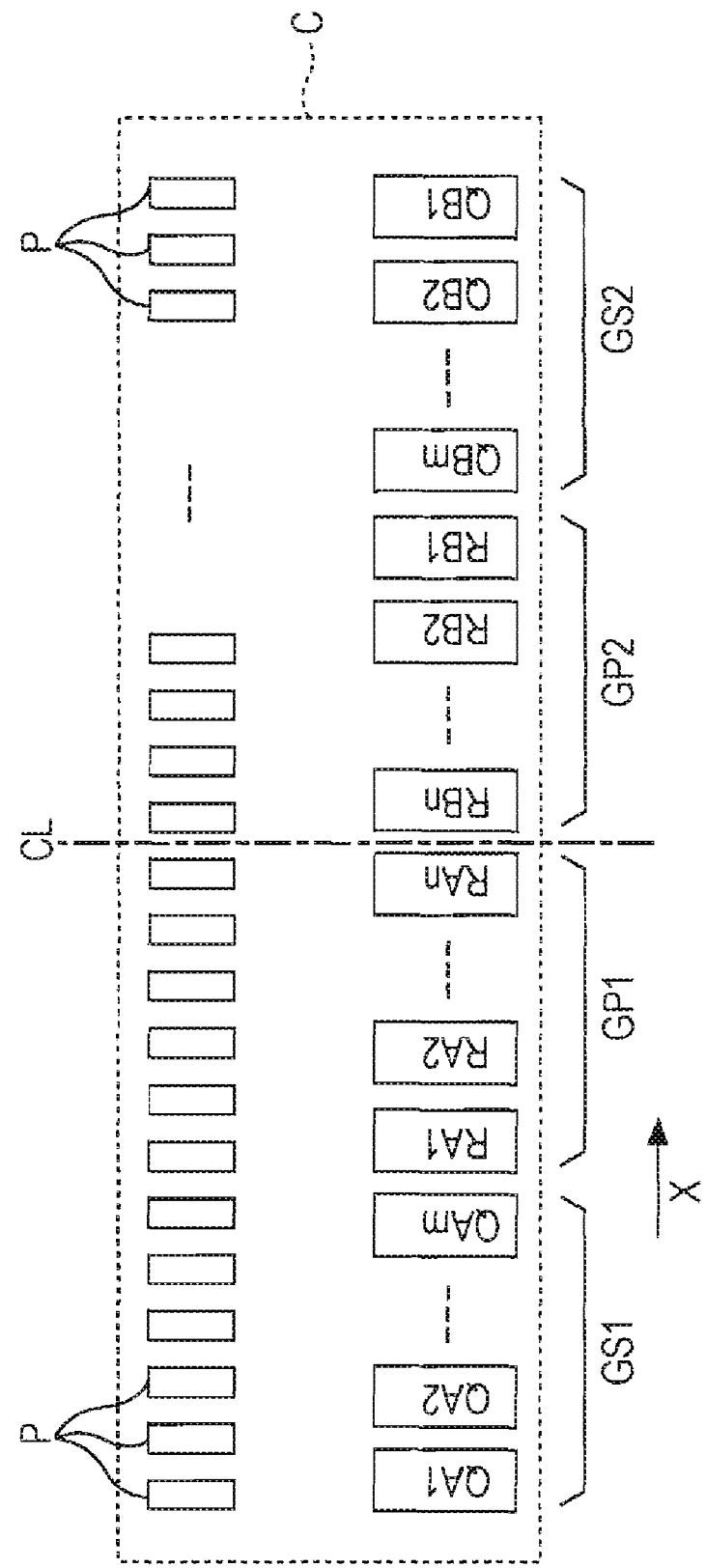
FIG. 4 is a schematic diagram showing the relationship among terminals in the IC chip.

FIG. 4 is a plan view showing an arrangement of terminals in one of the IC chips C. Referring to FIG. 4, the outer shape of the IC chip C, when viewed from a direction perpendicular to the substrate 12 (from the front side of the page showing FIG. 1), is shown by the broken line. As shown in FIGS. 2 and 4, one of the IC chips C includes N output terminals P and a plurality of connection terminals. The N output terminals P are arranged in the X direction along the periphery of the IC chip Ck facing the light-emitting portion 14, and correspond to the electro-optic elements E in the k-th group G. The driving signal Xh generated in the current output circuit 219 is supplied from the h-th output terminal P to a corresponding one of the electro-optic elements E. A configuration in which the N output terminals P are arranged not only along a long side but also along each of the short sides of the IC chip C can be employed.

The plurality of connection terminals can be arranged with uniform spaces in the X direction along the periphery on the side opposite to the light-emitting portion 14 in the IC chip C. The connection terminals are divided into signal terminal blocks GS1 and GS2 and power terminal blocks GP1 and GP2. As shown in FIG. 4, the signal terminal block GS1 and the power terminal block GP1 are placed on the negative side of the X axis when viewed with respect to a central line CL (line passing through the center of the figure showing the IC chip C and perpendicular to the X axis) of the IC chip C, and the signal terminal block GS2 and the power terminal block GP2 are placed on the positive side of the X axis when viewed with respect to the central line CL. The configuration in which the IC chips C are arranged with uniform spaces is not necessarily required.

As shown in FIG. 4, the signal terminal block GS1 includes m signal terminals QA1 to QAm, and the signal terminal block GS2 includes m signal terminals QB1 to QBm (m is an positive integer). The signal terminal QAj, which is the j-th (j is an integer satisfying $1 \leq j \leq m$) signal terminal counted in the positive X direction in the signal terminal block GS1, and the signal terminal QBj, which is the j-th signal terminal counted in the negative X direction in the signal terminal block GS2, are symmetrically arranged about the central line CL.

As shown in FIG. 2, the signal terminals QAj and QBj are connected to each other in the IC chip C. Accordingly, a signal supplied to the signal terminal QAj is used to control the drive circuit 21 and is output from the signal terminal QBj. Each of buffer circuits 23 is placed between one of the signal terminals QA2 to QAm and the corresponding signal terminal QBj. In contrast, a delay circuit 25 is placed between the signal terminal QA1 and the signal terminal QB1. The starting pulse SP is supplied to the signal terminal QA1 in the IC chip C, and the control signals SC excluding the starting pulse SP are supplied to the signal terminals QA2 to QAm. The delay circuit 25 delays the starting pulse SP, which is supplied to the signal terminal QA1, by N periods of the clock signal CLK to output the delayed signal to the signal terminal QB1.

Figure 5:
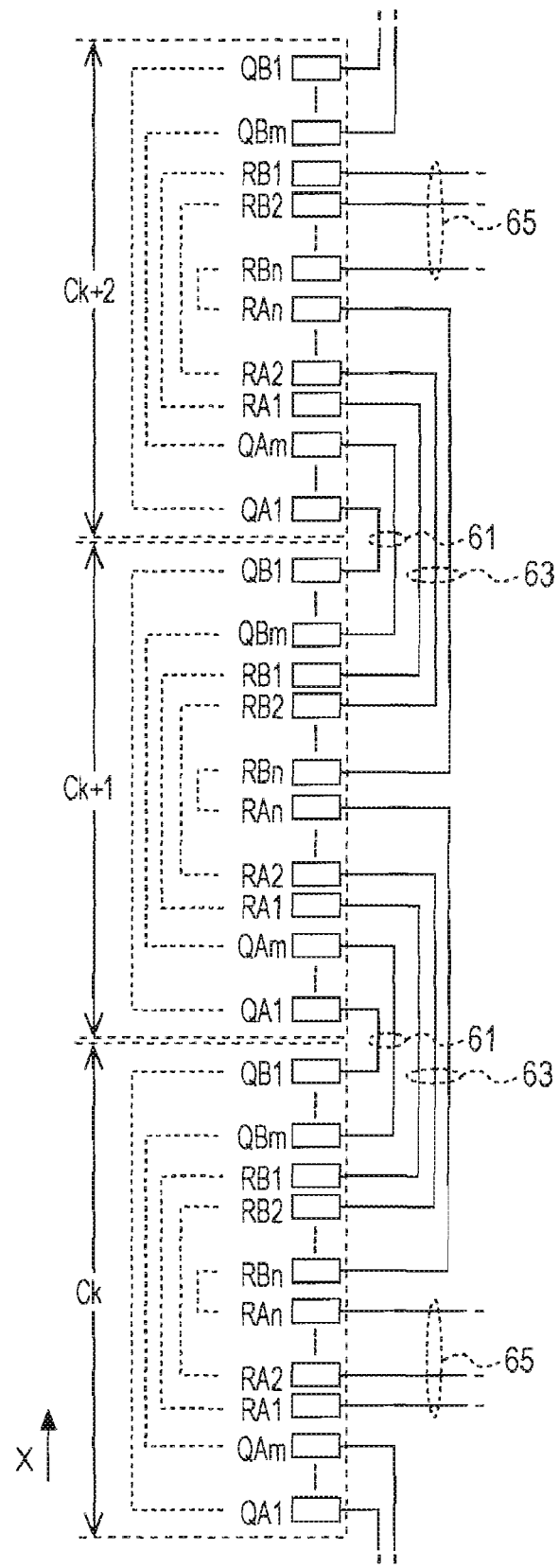
FIG. 5 is a schematic diagram showing connections of the terminals in the IC chip.

FIG. 5 is a plan view showing electrical connections of the terminals in each of the IC chips C. As shown in FIG. 5, the IC chips C adjacent to one another in the X direction are connected to one another in a cascade configuration. That is, the signal terminal QBj in the IC chip Ck and the signal terminal QAj in the IC chip Ck+1 adjacent to the IC chip Ck in the positive X direction are electrically connected through a corresponding one of signal trunk lines 61 configured on a corresponding one of the flexible printed circuit substrates 51. As shown in FIG. 1, the terminal signals QA1 to QAm in the IC chip C1 are electrically connected to the control circuit 32 through signal supply lines 62 configured on a flexible printed circuit substrate 53.

In the configuration above, a corresponding one of the control signals SC is supplied from the control circuit 32 through a corresponding one of the signal supply lines 62 to the signal terminal QAj in the IC chip C1 and supplied from the signal terminal QBj in the IC chip Ck-1 that is the previous stage of one of the second to m-th stages through a corresponding one of the signal trunk lines 61 to the signal terminal QAj in the IC chip Ck that is one of the second to m-th stages. That is, the control signals SC output from the control circuit 32 are transferred from the IC chip C1 sequentially to the IC chips C2 to CM in the positive X direction. The starting pulse SP is transferred sequentially from the IC chip C1 to the IC chip CM while delayed by N periods of the clock signal CLK in the delay circuit 25 of each of the IC chips C. Accordingly, periods in which the levels of the sampling signals S1 to SN reach the active level do not overlap one another in the plurality of the drive circuits 21 (that is, the gradation data D of the electro-optic elements E is acquired without overlap).

As shown in FIGS. 2 and 4, the power terminal block GP1 includes n power terminals RA1 to RAn, and the power terminal block GP2 includes n power terminals RB1 to RBn (n is a positive integer). The power terminal RAi, which is the i-th (i is an integer satisfying $1 \leq i \leq n$) power terminal counted in the positive X direction in the power terminal block GP1, and the power terminal RBi, which is the i-th power terminal counted in the negative X direction in the power terminal block GP2, are symmetrically arranged about the central line CL. As shown in FIG. 2, the power terminals RAi and RBi are connected to each other in the IC chip C. Accordingly, a potential supplied to one of the power terminals RAi and RBi is supplied to the drive circuit 21 and is output from the other one of the power terminals RAi and RBi.

As shown in FIG. 5, the power terminal RBi in the IC chip Ck and the power terminal RAi in the IC chip Ck+1 are electrically connected to each other through a corresponding one of power trunk lines 63 (not shown in FIG. 1) configured on a corresponding one of the flexible printed circuit substrates 51. For example, the power terminal RBn in the IC chip Ck and the power terminal RAn in the IC chip Ck+1 are connected to each other through a corresponding one of the power trunk lines 63, and the power terminal RB1 in the IC chip Ck and the power terminal RA1 in the IC chip Ck+1 are connected to each other through a corresponding one of the power trunk lines 63. Similarly, the power terminal RBi in the IC chip Ck+1 and the power terminal RAi in the IC chip Ck+2 are connected to each other through a corresponding one of the power trunk lines 63 configured on a corresponding one of the flexible printed circuit substrates 51. In contrast, as shown in FIGS. 1 and 5, the power terminals RA1 to RAn in the IC chip Ck are connected through corresponding ones of electric supply lines 65 configured on a corresponding one of the flexible printed circuit substrates 51 to the power supply circuit 34. Similarly, the power terminals RB1 to RBn in the IC chip Ck+2 are connected through corresponding ones of the electric supply lines 65 configured on a corresponding one of the flexible printed circuit substrates 51 to the power supply circuit 34.

In the configuration above, a potential supplied from the power supply circuit 34 through a corresponding one of the electric supply lines 65 to the power terminal RAi in the IC chip Ck is supplied from the power terminal RBi in the IC chip Ck through a corresponding one of the power trunk lines 63 to the power terminal RAi in the IC chip Ck+1 that is the next stage. A potential supplied from the power supply circuit 34 through a corresponding one of the electric supply lines 65 to the power terminal RBi in the IC chip Ck+2 is supplied from the power terminal RAi in the IC chip Ck+2 through a corresponding one of the power trunk lines 63 to the power terminal RBi in the IC chip Ck+1 that is the previous stage.

As described above, in the first embodiment, while the power supply potentials VP are directly supplied from the power supply circuit 34 to the IC chips Ck and Ck+2, the power supply potentials VP are indirectly supplied through the IC chips Ck and Ck+2 to the IC chip Ck+1. Accordingly, a configuration in which the power trunk lines 63 and the electric supply lines 65 intersect one another is not required. Additionally, since the signal terminal blocks GS1 and CS2 are arranged on the both sides of the power terminal blocks GP1 and GP2 in each of the IC chips C, a configuration in which the signal trunk lines 61 and the power trunk lines 63 intersect one another is not required also. As described above, because the number of portions in which wiring patterns intersect one another can be decreased in the first embodiment, problems due to intersections of wiring patterns can be effectively prevented.

In view of the reduction of the number of portions in which wiring patterns intersect one another, a configuration (hereinafter, referred to as a "comparative example") in which the power terminal RAi in each of the IC chips C that are the second to later stages is connected to the power terminal RBi in the IC chip C that is the previous stage of one of the second to later stages and the power terminal RAi in the IC chip C that is the first stage is connected to the power supply circuit 34 can be employed. However, in the comparative example, because the lengths of paths through which the power supply potentials VP are supplied from the power supply circuit 34 to the IC chip CM that is the last stage are increased, the negative effect of different voltage drops between the power supply potentials VP in the IC chip C1 and the power supply potentials VP in the IC chip CM becomes obvious. In contrast, in the first embodiment, the power supply potentials VP are supplied from the power supply circuit 34 to the intervenient IC chips C (for example, the IC chips Ck and Ck+2 shown in FIG. 5) in the array including the M IC chips C, namely the IC chips C1 to CM. Accordingly, the negative effect due to the voltage drops can be reduced compared with that in the comparative example.

Second Embodiment

Next, a second embodiment according to the invention will be described. The reference numerals in the second embodiment refer to the same elements as those with the same operations and functions in the first embodiment, and the detailed descriptions thereof are omitted.

Figure 6:
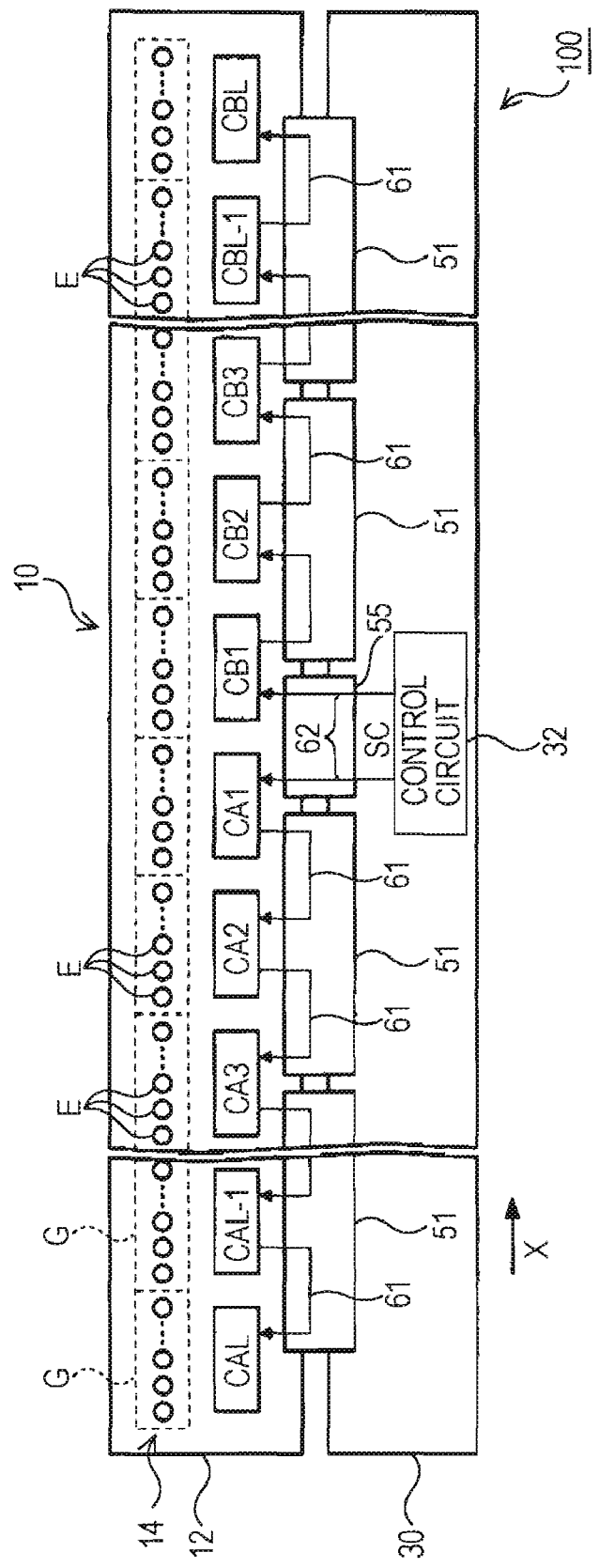
FIG. 6 is a plan view showing a configuration of an electro-optic device according to a second embodiment.

FIG. 6 is a plan view showing a configuration of the electro-optic device 100. As shown in FIG. 6, the M IC chips C mounted on the substrate 12 of the exposure unit 10 are divided into L (L=M/2) IC chips CA (CA1 to CAL) and L IC chips CB (CB1 to CBL). The IC chips CA1 to CAL are arranged in the order of 1 to L from the vicinity of the center of the substrate 12 in the negative X direction, and the IC chips CB1 to CBL are arranged in the order of 1 to L from the vicinity of the center of the substrate 12 in the positive X direction. The configuration of each of the IC chips CA is the same as that of each of the IC chips CB. The control circuit 32 is electrically connected through a flexible printed circuit substrate 55 fixed at the center of the substrate 12 in the X direction to the exposure unit 10 (IC chips C).

Figure 7:
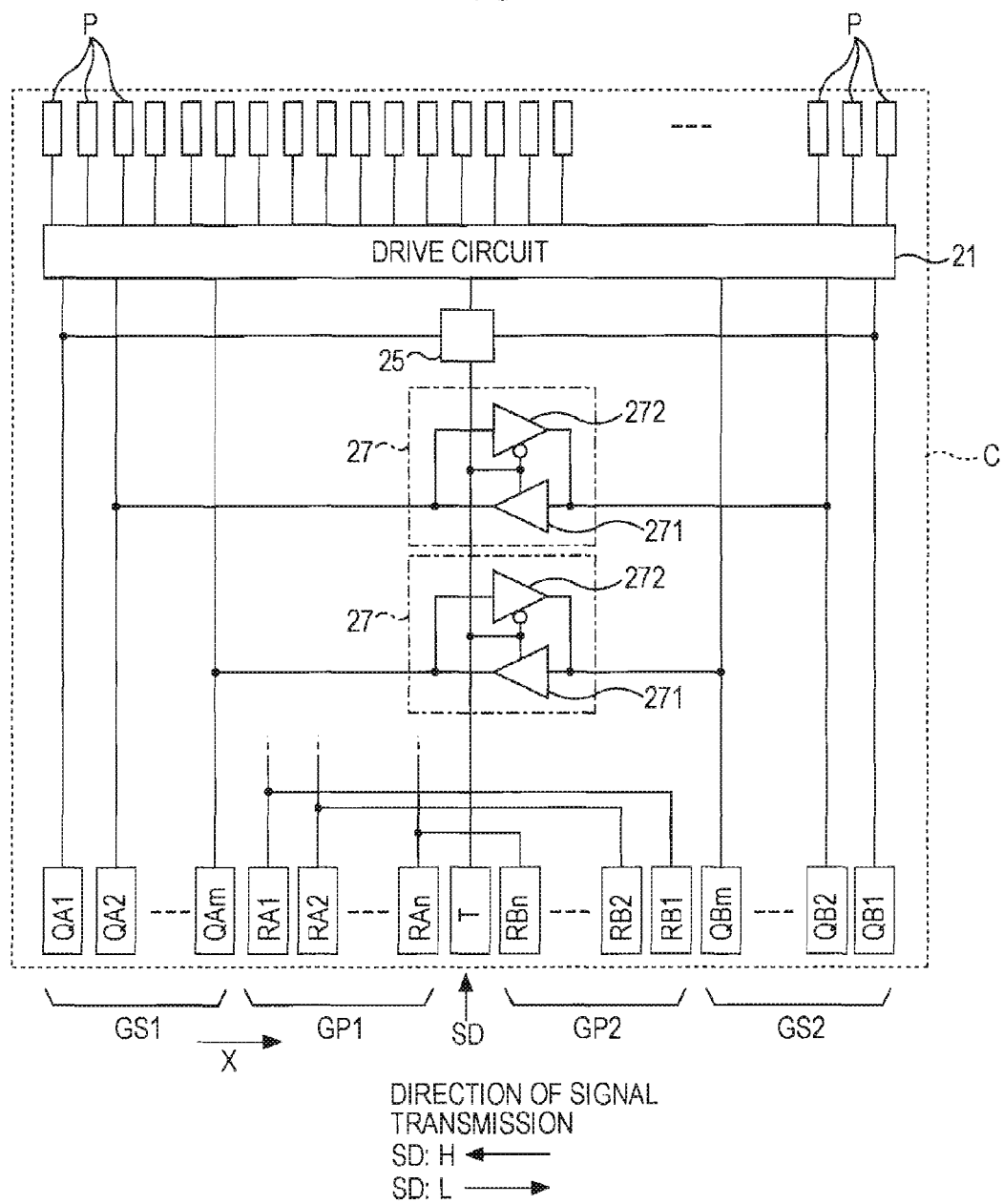
FIG. 7 is a block diagram showing an electrical configuration of an IC chip.

FIG. 7 is a block diagram showing an electrical configuration of one of the IC chips C (CA and CB). As shown in FIG. 7, the IC chip includes a control terminal T in addition to the power terminals RA1 to RAn and RB1 to RBn, and the signal terminals QA1 to QAm and QB1 to QBm. The control terminal T is placed in a space between the power terminal RAn and the power terminal RBn (at the center of a long side of the IC chip C in the X direction). A direction control signal SD is supplied from the control circuit 32 to the control terminal T.

Besides the function of delaying the starting pulse SP, the delay circuit 25 shown in FIG. 7 has an additional function of changing the direction of signal transmission on the basis of the direction control signal SD. That is, when the level of the direction control signal SD is low, the delay circuit 25 delays the starting pulse SP supplied to the signal terminal QAj to supply the delayed signal to the signal terminal QBj. In contrast, when the level of the direction control signal SD is high, the delay circuit 25 delays the starting pulse SP supplied to the signal terminal QBj to supply the delayed signal to the signal terminal QAj.

As shown in FIG. 7, the IC chip C in the second embodiment includes switching circuits 27 instead of the buffer circuits 23 shown in FIG. 2. Each of the switching circuits 27 includes two buffer circuits 271 and 272 arranged in directions opposite to each other. That is, the output of the buffer circuit 271 and the input of the buffer circuit 272 are connected to the signal terminal QAj, and the input of the buffer circuit 271 and the output of the buffer circuit 272 are connected to the signal terminal QBj.

When the level of the direction control signal SD is set to the high level, the buffer circuit 271 enters an active state (low-impedance state), and the buffer circuit 272 enters a high-impedance state. In contrast, when the level of the direction control signal SD is set to the low level, the buffer circuit 271 enters the high-impedance state, and the buffer circuit 272 enters the active state. Accordingly, as shown at the bottom of FIG. 7, when the level of the direction control signal SD is high, a signal input to the signal terminal QBj is supplied to the drive circuit 21 and is output through the buffer circuit 271 to the signal terminal QAj, so that signal transmission from the signal terminal QAj to the signal terminal QBj is prohibited. In contrast, when the level of the direction control signal SD is low, a signal input to the signal terminal QAj is supplied to the drive circuit 21 and is output through the buffer circuit 272 to the signal terminal QBj, so that signal transmission from the signal terminal QBj to the signal terminal QAj is prohibited.

As shown in FIG. 6, the signal terminal QBj in each of the IC chips CA2 to CAL is connected through a corresponding one of the signal trunk lines 61 configured on a corresponding one of the flexible printed circuit substrates 51 to the signal terminal QAj in a corresponding one of the IC chips CA adjacent to the above-described one of the IC chips CA2 to CAL in the positive X direction. Similarly, the signal terminal QAj in each of the IC chips CB2 to CBL is connected through a corresponding one of the signal trunk lines 61 configured on a corresponding one of the flexible printed circuit substrates 51 to the signal terminal QBj in a corresponding one of the IC chips CB adjacent to the above-described one of the IC chips CB2 to CBL in the negative X direction. Additionally, the signal terminals QB1 to QBm in the IC chip CA1 and the signal terminals QA1 to QAm in the IC chip CB1 are connected through the signal trunk lines 62 configured on the flexible printed circuit substrate 55 to the control circuit 32. The connection between the power terminal RAi and the power terminal RBi in each of the IC chips C is the same as that in the first embodiment. Accordingly, as in the first embodiment, the number of portions in which the power trunk lines 63 and the electric supply lines 65 intersect one another can be reduced.

The direction control signal SD with the high level is supplied to each of the IC chips CA1 to CAL. As indicated by the arrows in FIG. 6, the control signals SC supplied from the control circuit 32 to the IC chip CA1 pass sequentially through the IC chips CA1 to CAL to be transmitted from the positive side to the negative side of the X axis while being used to control the drive circuits 21. In contrast, the direction control signal SD with the low level is supplied to each of the IC chips CB1 to CBL. Accordingly, the control signals SC supplied from the control circuit 32 to the IC chip CB1 pass sequentially through the IC chips CB1 to CBL to he transmitted from the negative side to the positive side of the X axis.

In the configuration in which the control signals SC are transmitted from one end of the array of the IC chips C to the other end as in the first embodiment, distortions of the control signals SC may be increased from when the control circuit 32 outputs the control signals SC until when the control signals SC reach the IC chip CM that is the final stage. However, in the second embodiment, since the control signals SC output from the control circuit 32 are transmitted from the central IC chips C (CA1 and CB1) to ends of the substrate 12, the distortions of the control signals SC, when the control signals SC reach the IC chips CAL and CBL, can be suppressed compared with those in the first embodiment.

Furthermore, in the second embodiment, since the direction of transmission of the control signals SC in the IC chips C can be switched on the basis of the direction control signal SD, the IC chips CA1 to CAL and the IC chips CB1 to CBL can be configured as common IC chips. Thus, the manufacture cost of the electro-optic device 100 can be reduced compared with that in a case where the IC chips CA and the IC chips CB can be configured as different IC chips.

MODIFICATIONS

Various modifications can be made to each of the embodiments described above. Specific modifications will be described below. The following modifications can be combined in a suitable manner.

First Modification

Figure 8:
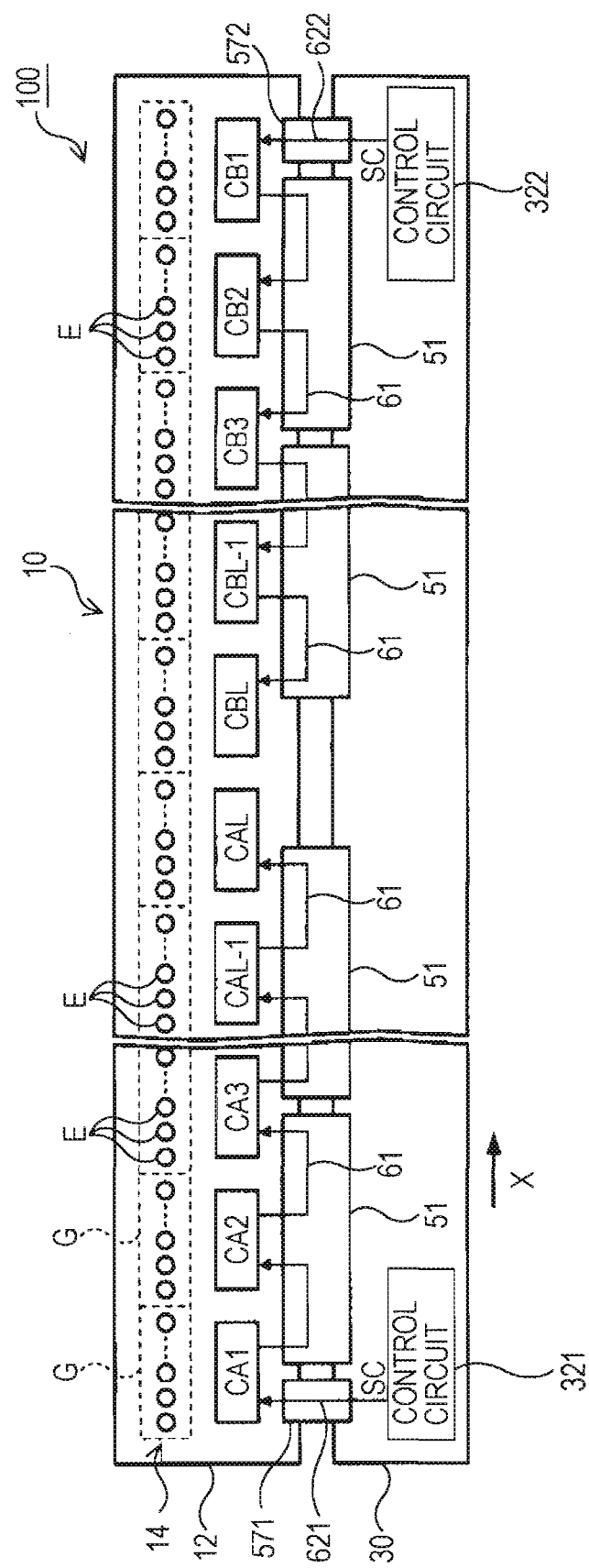
FIG. 8 is a plan view showing a configuration of an electro-optic device according to a modification.

Although the configuration in which the control signals SC are transmitted from the center to ends of the exposure unit 10 positioned on the X axis is described in the second embodiment, as shown in FIG. 8, a configuration in which the control signals SC are transmitted from the ends to the center of the exposure unit 10 positioned on the X axis can be employed. In the configuration shown in FIG. 8, the IC chips CA1 to CAL are arranged from the left end of the substrate 12 in the positive X direction, and the IC chips CB1 to CBL are arranged from the right end of the substrate 12 in the negative X direction. The IC chips CA1 to CAL and the IC chips CB1 to CBL have the same configuration shown in FIG. 5, The level of the direction control signal SD supplied to each of the IC chips CA1 to CAL is set to the low level, and the level of the direction control signal SD supplied to each of the IC chips CB1 to CBL is set to the high level. Accordingly, the control signals SC supplied from a control circuit 321 through signal supply lines 621 on a flexible printed circuit substrate 571 to the IC chip CA1 are transmitted in the positive X direction to reach the IC chip CAL, and the control signals SC supplied from a control circuit 322 through signal supply lines 622 on a flexible printed circuit substrate 572 to the IC chip CB1 are transmitted in the negative X direction to reach the IC chip CBL. The same advantages as those in the second embodiment can be also obtained with the configuration described above.

Second Modification

Although the configuration in which the signal trunk lines 61 are configured on the flexible printed circuit substrates 51 is described in each of the embodiments described above, a configuration in which the signal trunk lines 61 are configured on the surface of the substrate 12 can be employed. A configuration in which the signal trunk lines 61 and the power trunk lines 63 are configured on separate printed circuit substrates can be also employed. Furthermore, the position at which the control circuit 32 or the power supply circuit 34 is mounted can be modified. For example, the control circuit 32 or the power supply circuit 34 may be mounted on one of the flexible printed circuit substrates 51.

Third Modification

An organic light-emitting diode is only an example of the electro-optic element E. For the electro-optic element applied in the electro-optic devices according to the embodiments of the invention, whether a light-emitting element that emits light or the non-light-emitting element (for example, a liquid crystal element) that changes the transmittance of external light is used, or whether a current-driven element that is driven by a supplied current or a voltage-driven element that is driven by an applied voltage is used does not present any problems. For example, various electro-optic elements, such as inorganic EL elements, field-emission (FE) elements, surface-conduction electron-emitter (SE) elements, ballistic electron surface emitting (BS) elements, light emitting diode (LED) elements, liquid crystal elements, electrophoresis elements, or electrochromic elements can be used in an embodiment according to the invention.

Applications

Figure 9:
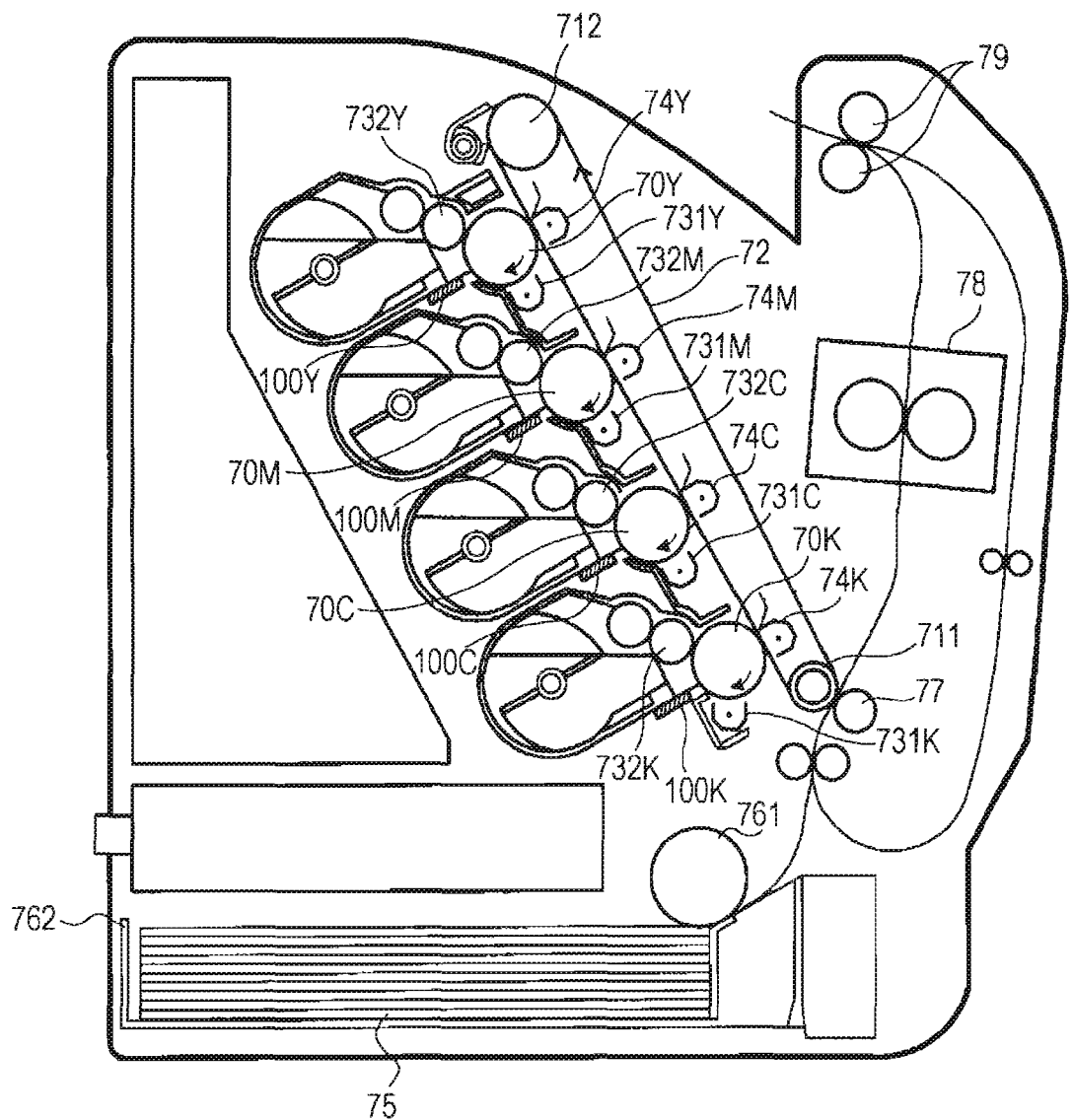
FIG. 9 is a cross-sectional view showing a configuration of an electronic apparatus (image forming apparatus).
Figure 10:
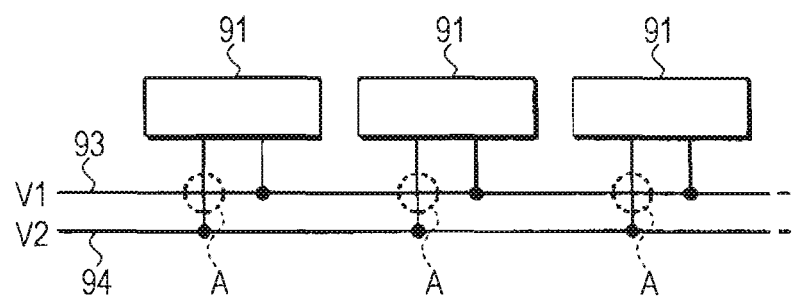
FIG. 10 is a plan view showing a configuration of an electro-optic device in the related art.

An electronic apparatus (image forming apparatus) using the electro-optic device 100 according to the embodiments described above will be described below. FIG. 9 is a cross-sectional view showing a configuration of the image forming apparatus employing the electro-optic device 100. The image forming apparatus, which is a tandem-type full-color image forming apparatus, includes four electro-optic devices 100 (100K, 100C, 100M, and 100Y) according to the embodiments described above and four photosensitive drums 70 (70K, 70C, 70M, and 70Y) each of which corresponds to one of the electro-optic devices 100. Each of the electro-optic devices 100 is placed so as to face an image forming face (peripheral face) of a corresponding one of the photosensitive drums 70. The suffixes K, C, M, and Y of the reference numerals indicate that the elements with the suffixes are used to form each of black (K), cyan (C), magenta (M), and yellow (Y) visualized images, respectively.

As shown in FIG. 9, an endless intermediate transfer belt 72 is wound around a driving roller 711 and a driven roller 712. The four photosensitive drums 70 are placed around the intermediate transfer belt 72 with predetermined spaces thereamong. The photosensitive drums 70 rotate in synchronization with driving of the intermediate transfer belt 72.

Corona chargers 731 (731K, 731C, 731M, and 731Y) and developing devices 732 (732K, 732C, 732M, and 732Y) as well as the electro-optic devices 100 are placed around the photosensitive drums 70. Each of the corona chargers 731 allows the image forming face of a corresponding one of the photosensitive drums 70 to be charged. Each of the electro-optic devices 100 exposes the charged image forming face to form an electrostatic latent image. Each of the developing devices 732 deposits developer (toner) on the electrostatic latent image to form a corresponding one of the visualized images (visible images) on a corresponding one of the photosensitive drums 70.

As described above, the visualized images in the respective colors (black, cyan, magenta, and yellow) formed on the photosensitive drums 70 are primarily transferred sequentially onto the surface of the intermediate transfer belt 72 to form a full-color visualized image. Four primary transfer corotrons 74 (74K, 74C, 74M, and 74Y) (transfer units) are placed on the inner side of the intermediate transfer belt 72. Each of the primary transfer corotrons 74 electrostatically attracts a corresponding one of the visualized images from a corresponding one of the photosensitive drums 70 to transfer the visualized image onto the intermediate transfer belt 72 passing through a space between the photosensitive drum 70 and the primary transfer corotron 74.

Sheets 75 (recording materials) are fed by a pickup roller 761 one by one from a sheet feed cassette 762 and transported to a nip abutting the intermediate transfer belt 72 and a secondary transfer roller 77. The full-color visualized image formed on the intermediate transfer belt 72 is secondarily transferred onto one side of one of the sheets 75 by the secondary transfer roller 77 and passes between a pair of fixing rollers 78 to be fixed on the sheet 75. A pair of sheet discharge rollers 79 discharges the sheet 75 on which the visualized image is fixed after the above-described process.

Since the image forming apparatus exemplified above uses organic light-emitting diodes as light sources (exposing units), the size of the image forming apparatus can be smaller than that of an apparatus with a configuration in which a laser-scanning-optical system is used. The electro-optic device 100 can be applied in an image forming apparatus with a configuration other than the configurations exemplified above. For example, the electro-optic device 100 can be used in an image forming apparatus using a rotary developing system, an image forming apparatus of a type that transfers a visualized image from a photosensitive drum directly onto a sheet without using an intermediate transfer belt, or an image forming apparatus for forming a monochrome image, The applications of the electro-optic device 100 are not limited to the exposure of an image carrier. For example, an image reading device can employ the electro-optic device 100 as an illuminating device for illuminating an object to be read, such as an original document. This type of image reading device may be a scanner, a reading unit of a copier or a facsimile machine, a bar code reader, or a two-dimensional-image-code reader for reading a two-dimensional-image code such as a QR code®.

Additionally, electro-optic devices in which the electro-optic elements E are arranged in a matrix may be used as display devices in various types of electronic apparatuses. For example, electronic apparatuses in which the electro-optic devices according to the embodiments of the invention are applied may be mobile personal computers, cellular telephones, personal digital assistants (PDA), digital still cameras, televisions, video camera, car navigation systems, pagers, digital diaries, electronic paper, calculators, word processors, workstations, videophones, point-of-sales (POS) terminals, printers, scanner, copiers, video players, apparatuses provided with touch panels, or the like.

The entire disclosure of Japanese Patent Application No. 2006-319739, filed. Nov. 28, 2006 is expressly incorporated by reference herein.

What is claimed is:

1. An electro-optic device comprising:
 a substrate on which a plurality of electro-optic elements are configured;
 a plurality of integrated circuit chips that drive the plurality of electro-optic elements, each of the plurality of integrated circuit chips including a first power terminal and a second power terminal connected to each other in the integrated circuit chip, a third power terminal sandwiching the first power terminal with the second power terminal and placed on a first side opposite to the second power terminal, and a fourth power terminal sandwiching the second power terminal with the first power terminal and placed on a second side opposite to the first power terminal; and
 a plurality of wiring patterns including a first power trunk line connecting the second power terminal in a first integrated circuit chip among from the plurality of integrated circuit chips and the first power terminal in a second integrated circuit chip placed on the second side of the first integrated circuit chip, a second power trunk line connecting the fourth power terminal in the first integrated circuit chip and the third power terminal in the second integrated circuit chip, a first electric supply line that supplies a first potential for driving the electro-optic elements from a power supply circuit to the first power terminal in the first integrated circuit chip, and a second electric supply line that supplies a second potential for driving the electro-optic elements from the power supply circuit to the third power terminal in the first integrated circuit chip.

2. The electro-optic device according to claim 1, wherein in each of the plurality of integrated circuit chips, the first and second power terminals are symmetrically arranged about a predetermined reference line, and the third and fourth power terminals are symmetrically arranged about the predetermined reference line.

3. The electro-optic device according to claim 1,
 wherein each of the plurality of integrated circuit chips includes a plurality of first signal terminals arranged on the first side of the third power terminal and a plurality of second signal terminals arranged on the second side of the fourth power terminal and connected to the corresponding plurality of first signal terminals in the integrated circuit chip and drives the electro-optic elements on the basis of a control signal supplied to a corresponding one of the plurality of first signal terminals, and wherein the plurality of wiring patterns include a plurality of signal trunk lines connecting each of the second signal terminals in the first integrated circuit chip and a corresponding one of the first signal terminals in the second integrated circuit chip.

4. The electro-optic device according to claim 3, wherein in each of the plurality of integrated circuit chips, each of the plurality of first signal terminals and a corresponding one of the plurality of second signal terminals connected to the first signal terminal are symmetrically arranged about the predetermined reference line of the integrated circuit chip.

5. The electro-optic device according to claim 3, wherein each of the plurality of integrated circuit chips includes a switching unit configured to switch between a first state in which the control signal supplied to the first signal terminal is output to the second signal terminal in the integrated circuit chip and a second state in which the control signal supplied to the second signal terminal is output to the first signal terminal in the integrated circuit chip, 6. The electro-optic device according to claim 5, wherein each of the plurality of integrated circuit chips includes a control terminal placed between the first power terminal and the second power terminal, and the switching unit is configured to switch between the first state and the second state on the basis of a signal supplied to the control terminal.

7. An electronic apparatus comprising the electro-optic device according to claim 1.

* * * * *